United States Patent
Brown

(10) Patent No.: US 7,298,344 B2
(45) Date of Patent: Nov. 20, 2007

(54) SERIES FED AMPLIFIED ANTENNA REFLECT ARRAY

(75) Inventor: Kenneth W. Brown, Yucaipa, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 11/508,085

(22) Filed: Aug. 22, 2006

(65) Prior Publication Data

US 2006/0279470 A1 Dec. 14, 2006

Related U.S. Application Data

(63) Continuation-in-part of application No. 10/153,140, filed on May 20, 2002, now Pat. No. 6,765,535.

(51) Int. Cl.
*H01Q 21/26* (2006.01)
(52) U.S. Cl. ...................... 343/797; 343/816
(58) Field of Classification Search ............ 343/793, 343/797, 810, 816, 820
See application file for complete search history.

(56) References Cited

U.S. PATENT DOCUMENTS

| | | | | |
|---|---|---|---|---|
| 6,005,530 | A * | 12/1999 | Jovanovich et al. | 343/827 |
| 6,396,449 | B1 * | 5/2002 | Osterhues et al. | 343/754 |
| 6,870,513 | B2 * | 3/2005 | Deng et al. | 343/795 |

* cited by examiner

*Primary Examiner*—Hoang V. Nguyen
(74) *Attorney, Agent, or Firm*—John J. Horn

(57) ABSTRACT

A reflect array antenna. The array includes a plurality of unit cells. Each cell includes a first dipole antenna having a first orientation and a first polarization; a second dipole antenna having a second orientation and a second polarization; and an amplifier input coupled inline to said first dipole antenna and output coupled inline to said second dipole antenna. The array further includes N first dipole antennas having a first orientation and a first polarization; M second dipole antennas having a second orientation and a second polarization; and a plurality of unit cells, each cell including an amplifier input coupled inline to a first dipole antenna and output coupled inline to a second dipole antenna. The second orientation and the second polarization are orthogonal to the first orientation and the first polarization. Each amplifier includes a transistor with an input terminal and first and second output terminals. Each input terminal is connected to the first dipole antenna and the output terminals are coupled to the second dipole antenna. The first and second terminals are adapted to be coupled to second and first terminals respectively of a neighboring cell in the array. A direct current bias for the array is applied via the second dipole antenna. Input bias for the transistors is applied via the first dipole antenna. A unique gate bias voltage for each transistor in the array is provided on a row-by-row basis via a voltage divider network. The voltage divider network includes $(N-1)$ first resistors $R_b$ connected in series to a first source of supply potential, where N is the number of rows in the array. Each of the resistors is connected to provide an input voltage to one of the transistors in the array. The resistive network further includes M second resistors $R_L$ connected to a respective one of the second dipoles antennas, where M is the number of columns in the array. The array is fabricated by via a metallization pattern which is disposed on a first substrate to provide a chip. The chip is secured to a second substrate with a bonding agent. In the best mode, the bonding agent is an anisotropic electrically conductive bonding film that allows current to flow along a path orthogonal to a surface of the array while blocking current flow parallel to the surface of the array.

53 Claims, 6 Drawing Sheets

SERIES FED AMPLIFIED ANTENNA REFLECT ARRAY

REFERENCE TO RELATED APPLICATION

This is a continuation in part of U.S. patent application Ser. No. 10/153,140 filed May 20, 2002 by K. W. Brown et al. and entitled MONOLITHIC MILLIMETER WAVE REFLECTOR ARRAY SYSTEM which issued Jul. 20, 2004 as U.S. Pat. No. 6,765,535 the teachings of which are hereby incorporated herein by reference and from which priority is hereby claimed.

BACKGROUND OF THE INVENTION

1. Field of the Invention

The present invention relates to antennas. More specifically, the present invention relates to millimeter wave reflect array antennas and arrays thereof.

2. Description of the Related Art

As noted by the Institute of Electrical and Electronic Engineers (IEEE): "The millimeter-wave region of the electromagnetic spectrum is usually considered to be the range of wavelengths from 10 millimeters (0.4 inches) to 1 millimeter (0.04 inches). This means they are larger than infrared waves or x-rays, for example, but smaller than radio waves or microwaves. The millimeter-wave region of the electromagnetic spectrum corresponds to radio band frequencies of 30 GHz to 300 GHz and is sometimes called the Extremely High Frequency (EHF) range. The high frequency of millimeters waves as well as their propagation characteristics (that is, the ways they change or interact with the atmosphere as they travel) make them useful for a variety of applications including transmitting large amounts of computer data, cellular communications, and radar." See http://www.ieee-virtual-museum.org/collection/tech.php?id=2345917&lid=1.

For current more demanding applications, such as 'active denial', higher power millimeter waves, i.e. waves in the range of tens to thousands of watts, are required. Prior attempts to produce high power millimeter wave energy with solid-state devices have included waveguide and microstrip power combining. At millimeter wave frequencies, this method of combining typically produces unsatisfactory results due to heavy losses in the waveguide and/or microstrip medium.

Another approach involves the use of a spatial array. This approach has shown some promise. However, spatial arrays have not yet produced the power density levels that are required for the more demanding applications mentioned above.

One current approach involves the use of a reflect array amplifier. The reflect array has unit cells, each containing its own input antenna, power amplifier, and output antenna. These unit cells are then configured into an array of arbitrary size. Reflect arrays overcome feed losses by feeding each element via a nearly lossless free-space transmission path.

As disclosed and claimed in U.S. patent application entitled REFLECTIVE AND TRANSMISSIVE MODE MONOLITHIC MILLIMETER WAVE ARRAY SYSTEM AND IN-LINE AMPLIFIER USING SAME, filed Dec. 12, 2003 by K. Brown et al. (10/734445), the teachings of which are hereby incorporated herein by reference, reflect arrays differ from conventional arrays in that the input signal is delivered to the face of the array via free space, generally from a small horn antenna.

An active reflect array consists of a large number of unit cells arranged in a periodic pattern. Each reflect array element is equipped with two orthogonally-polarized antennas, one for reception and one for transmission, and an amplifier therebetween. That is, reflect arrays typically receive one linear polarization and radiate the orthogonal polarization, i.e., the receive antenna receives only vertically-polarized radiation and the transmit antenna transmits only horizontally-polarized radiation.

When integrated with the power-generating electronics on a thin semiconductor substrate, such antennas tend to have narrow bandwidths and high losses due to large surface currents. The size of each unit cell is constrained by the need to avoid grating lobes. For a fixed array with a main beam in the broadside direction, each unit cell may be no more than approximately 0.8 wavelengths on a side typically.

Higher power levels are attained by combining the outputs of multiple transistors. The drawback of this approach is that the power combiners themselves take up valuable area on the semiconductor wafer that could otherwise be occupied by power-generating circuitry.

Consequently, there was a need in the art for an improved system or method for generating a high power millimeter wave beam. Specifically, there was a need for a reflect array antenna capable of generating high power millimeter wave energy without significant loss.

The need was addressed by copending U.S. patent application Ser. No. 11/508,086 entitled AMPLIFIED PATCH ANTENNA REFLECT ARRAY, filed 22 Aug. 2006 by K. W. Brown the teachings of which are hereby incorporated by reference herein. Although this design addresses the need in the art, the array requires high current levels due to the parallel orientation of the amplifier columns in the array with respect to the direct current feed thereof. With multiple parallel columns in the array and potentially multiple chips, thousands of amps of DC current may be required. This requires high current cabling and tends to be lossy. This translates to higher power requirements, higher costs and more bulky arrays.

Hence, a need remains in the art for further improvements systems and methods for generating high power millimeter wave beams. Specifically, a need remains for a reflect array antenna capable of generating high power millimeter wave energy with minimal DC current requirements.

SUMMARY OF THE INVENTION

The need in the art is addressed by the reflect array antenna of the present invention. In the illustrative embodiment, the array includes a plurality of unit cells. Each cell includes a first dipole antenna having a first orientation and a first polarization; a second dipole antenna having a second orientation and a second polarization; and an amplifier input coupled inline to said first dipole antenna and output coupled inline to said second dipole antenna.

In the illustrative array implementation, the array includes N first dipole antennas having a first orientation and a first polarization; M second dipole antennas having a second orientation and a second polarization; and a plurality of unit cells, each cell including an amplifier input coupled inline to a first dipole antenna and output coupled inline to a second dipole antenna. The second orientation and the second polarization are orthogonal to the first orientation and the first polarization.

Each amplifier includes a transistor with an input terminal and first and second output terminals. Each input terminal is connected to the first dipole antenna and the output terminals are coupled to the second dipole antenna. The first and second terminals are adapted to be coupled to second and first terminals respectively of a neighboring cell in the array.

In the illustrative implementation, each transistor is a HEMT (High Electron Mobility Transistor). A coupling capacitor is connected to one of the output terminals on a first end thereof. A feed forward path is connected between the input terminal and a second end of the coupling capacitor. In the best mode, a resistor and an inductor are connected in series in the feed forward path.

In accordance with the invention, a direct current bias for the array is applied via the second dipole antenna. Input bias for the transistors is applied via the first dipole antenna. A unique gate bias voltage for each transistor in the array is provided on a row-by-row basis via a voltage divider network. The voltage divider network includes (N−1) first resistors $R_b$ connected in series to a first source of supply potential, where N is the number of rows in the array. Each of the resistors is connected to provide an input voltage to one of the transistors in the array. The resistive network further includes M second resistors $R_L$ connected to a respective one of the second dipoles antennas, where M is the number of columns in the array.

The array is fabricated by via a metallization pattern which is disposed on a first substrate to provide a chip. The chip is secured to a second substrate with a bonding agent. In the best mode, the bonding agent is an anisotropic electrically conductive bonding film that allows current to flow along a path orthogonal to a surface of the array while blocking current flow parallel to the surface of the array. The bonding agent is thermally conductive such that heat is transferred from the first substrate (containing the transistors) to the second substrate.

In the best mode, the array is implemented using an Indium Phosphide (InP) metamorphic high-electron mobility transistor (MHEMT) process.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
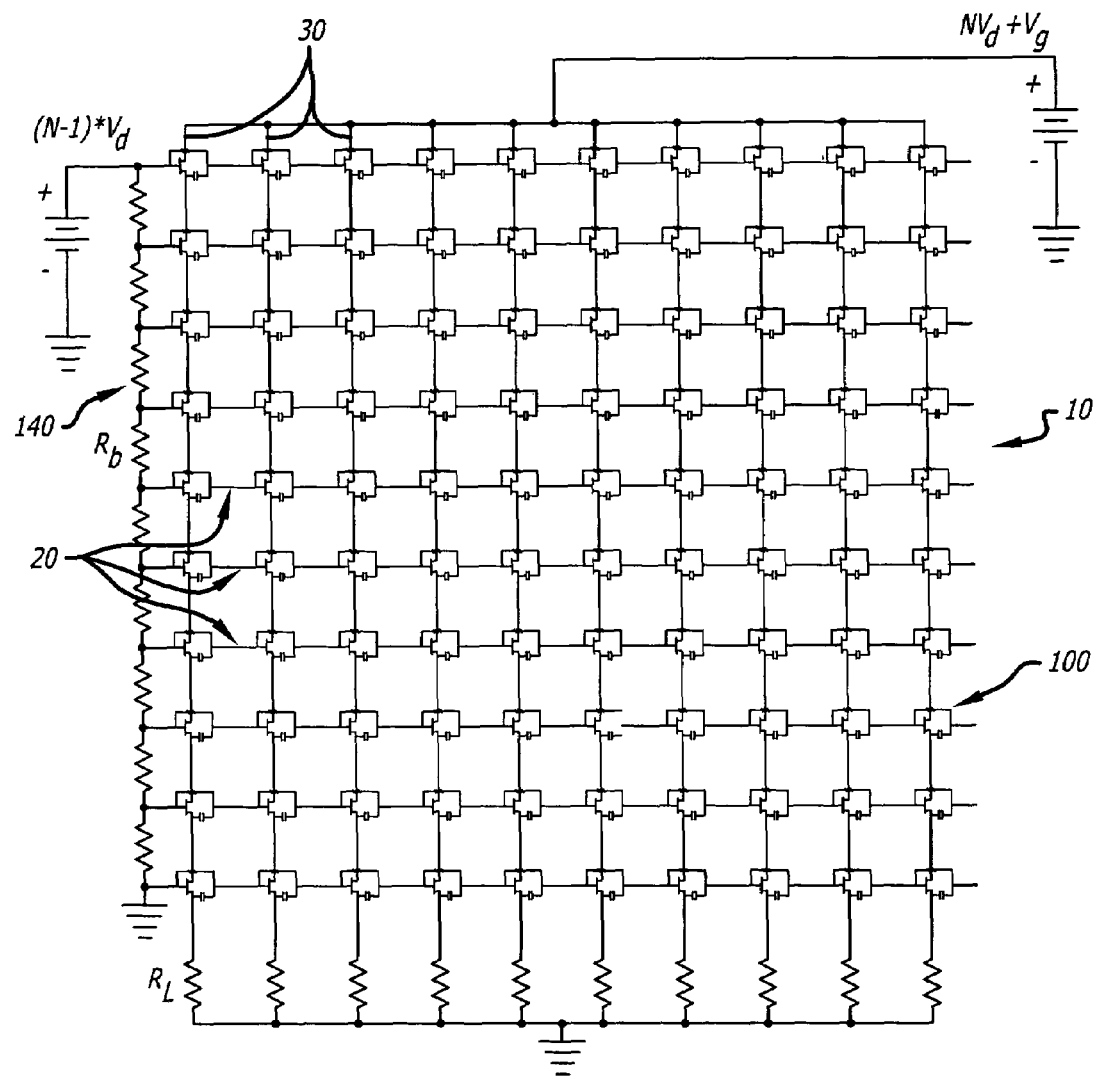
FIG. 1 is a schematic diagram of a series fed amplified reflect array implemented in accordance with an illustrative embodiment of the present teachings.

FIG. 1 is a schematic diagram of a series fed amplified reflect array 10 implemented in accordance with an illustrative embodiment of the present teachings.

Figure 2:
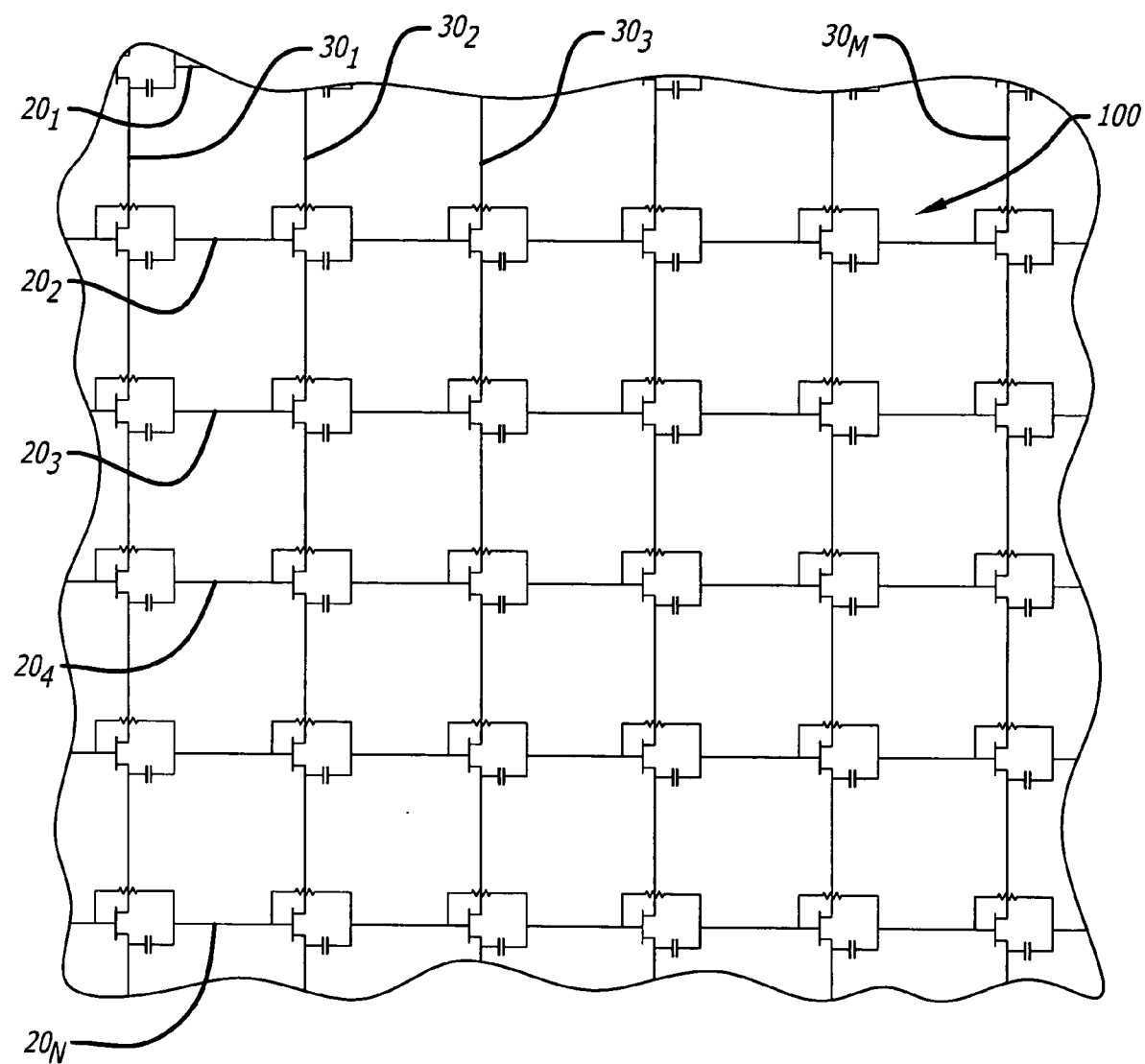
FIG. 2 is a magnified view a portion of the array of FIG. 1.

FIG. 2 is a magnified view a portion of the array 10 of FIG. 1. In the illustrative array implementation, the array includes N input dipole antennas $20_1$, $20_2$, $20_3$, ... $20_N$, where N is the number of rows and M output dipole antennas $30_1$, $30_2$, $30_3$, ... $30_M$, where M is the number of columns. In the illustrative array of FIG. 1, the input dipole antennas are disposed in a horizontal (row) orientation and are therefor adapted to receive energy from a low power source (not shown) of a horizontal polarization. In the illustrative embodiment, the output dipole antennas are disposed in a vertical (column) orientation and are therefor adapted to output energy of a vertical polarization. In addition to the dipole antennas, the array 10 includes a plurality of unit cells 100.

Figure 3:
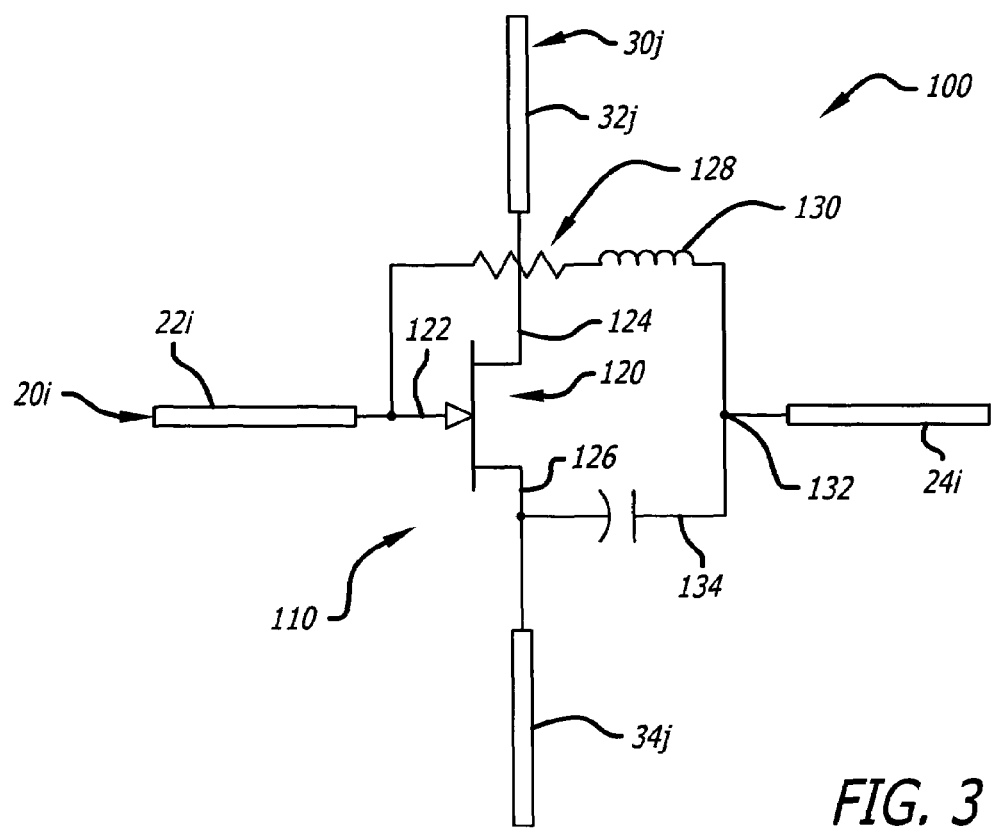
FIG. 3 is a schematic diagram of a unit cell of the array of FIG. 1.

FIG. 3 is a schematic diagram of a unit cell of the array 10 of FIG. 1. Here, a horizontally polarized input dipole feeds a transistor amplifier that, in turn, feeds a vertically polarized output dipole. Each cell includes an amplifier 110 input coupled inline to an input dipole antenna 20 and output coupled inline to an output dipole antenna 30. Each dipole antenna includes multiple elements. For example, as illustrated in FIG. 3, the input dipole antennas $20_i$ include left and right elements $22_i$ and $24_i$, respectively, where 'i' is the row number. Likewise, the output dipole antennas $30_j$ include top and bottom elements $32_j$ and $34_j$, where 'j' is the column number.

The transistor amplifier is in a common source configuration with the bottom output dipole leg DC isolated (with a capacitor) from the right input dipole leg as shown. Each amplifier 110 includes a transistor 120 with an input terminal 122 and first and second output terminals 124 and 126. In the illustrative implementation, each transistor is a field-effect transistor with gate, drain and source terminals 122, 124 and 126, respectively. The gate terminal 122 of each transistor 120 is connected to the left element 22 of the input dipole antenna 20, the drain terminal 124 is connected to the top element 32 of the output antenna 30 and source the terminal 126 is coupled to the bottom element 34 of the output dipole antenna 30.

A gate bias resistor 128 is series connected to an inductor 130 in a feed forward path between the gate terminal 122 and the right element 24 of the input dipole antenna 20 at an amplifier output node 132. The gate resistor 128 should be large enough in order to appear as an RF open-circuit when connected to the transistor. The inductor 130 should be large enough to pass DC and block RF signals from the input terminal of the first cell to the input terminal of the next cell.

A coupling capacitor 134 is connected between the source terminal of the transistor 120 and the amplifier output node 132. The coupling capacitor provides proper biasing for the transistor 120.

Hence, each amplifier 110 is coupled to the input and output dipole antennas in an inline configuration. That is, each cell 100 is connected between the left, right, top and bottom halves of the input and output antenna elements. In the array, the right half of the input antenna for each cell in a row is the left half of the input antenna for the next adjacent cell to the right in the row. Likewise, the bottom half of the output dipole antenna for each cell in a column is the top half of the output dipole antenna for the next cell down in the column.

Note that because of the unit cell topology, the drain voltage of each transistor amplifier is supplied by the output dipole legs, which are now interconnected along a particular column of the reflect array. Note also that because of this interconnection topology, each transistor amplifier of a particular column is connected in series (DC-wise) with all transistors in that column. This means that a much higher voltage can be utilized (than the standard 2-to-3 volts for MHEMT) on this chip, thus reducing the required current on the chip (which will lower the I-squared-R losses on the chip).

Note also from the topology of FIG. 3, that since the input dipole antenna elements are all interconnected along a row of the array, the gates of each transistor amplifier are connected in parallel with respect to direct current (DC). This is made possible by the gate resistor 128 that interconnects the left and right input dipole elements and by the coupling capacitor 134, which isolates the gate bias from the drain bias. This allows the gate bias to be applied through the input dipole element chain. An illustrative biasing arrangement in accordance with the present teachings is set forth more fully below with reference to FIG. 1.

Figure 4:
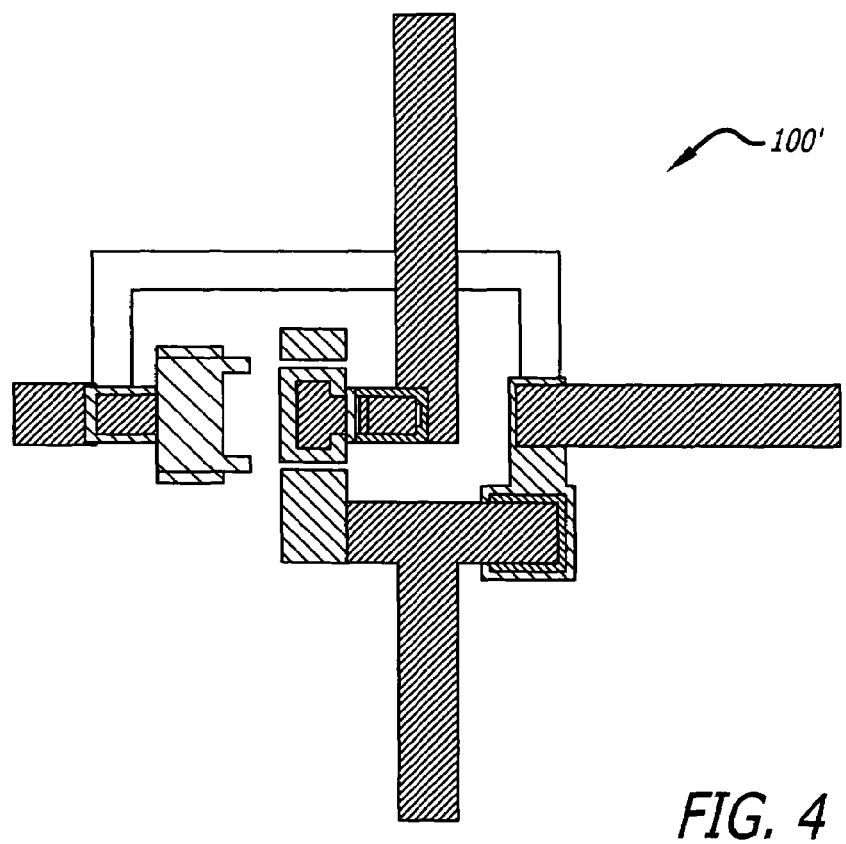
FIG. 4 is a circuit layout of the unit cell of FIG. 3 implemented in MHEMT technology.

FIG. 4 is a circuit layout of the unit cell of FIG. 3 implemented in MHEMT technology. As mentioned above, an MHEMT transistor is a metamorphic high-electron mobility transistor. In the best mode, the transistor is implemented in Indium Phosphide (InP) and fabricated on top of a Gallium Arsenide Wafer.

Figure 5:
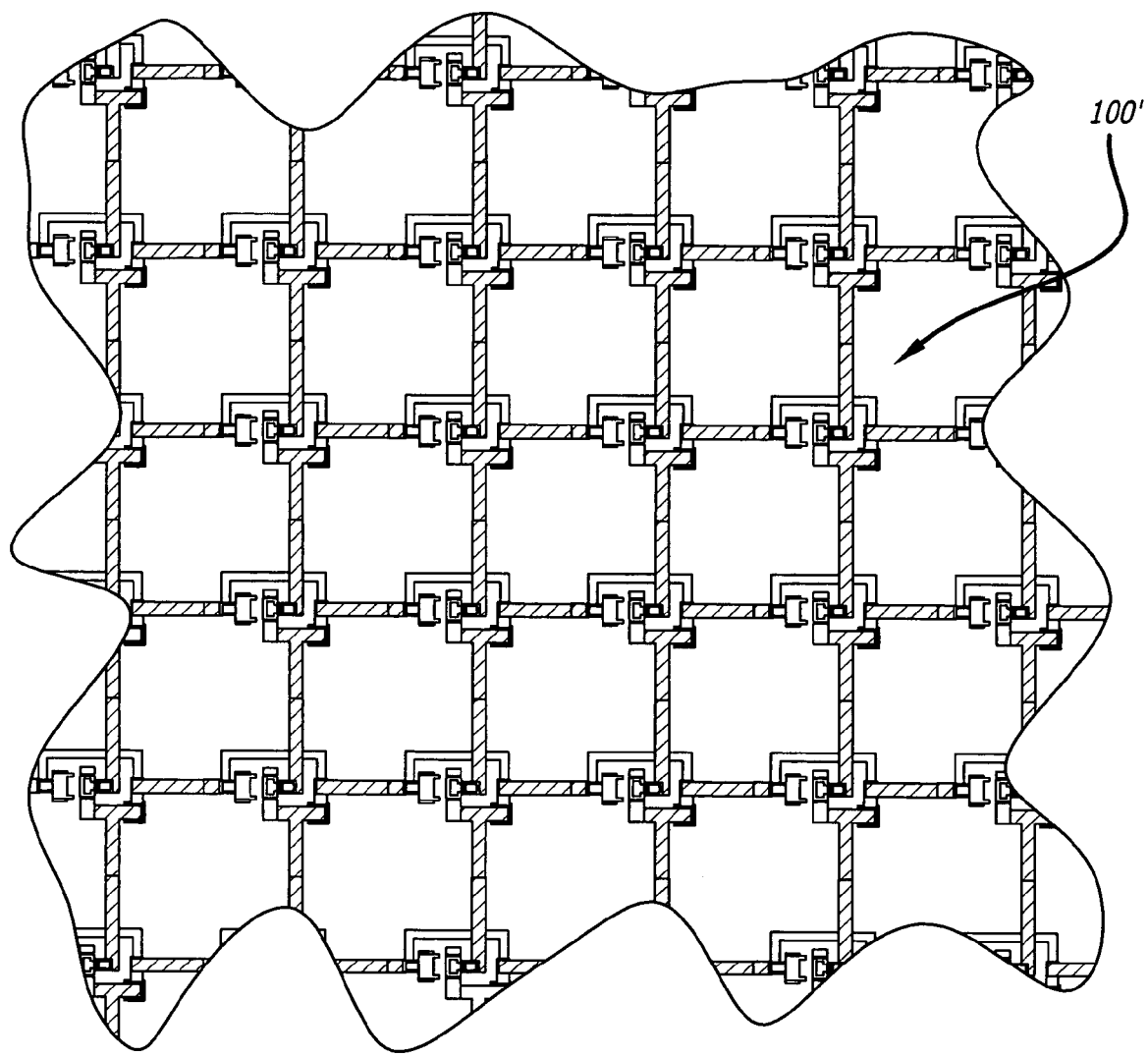
FIG. 5 shows how the cell of FIG. 4 can be combined with other cells to provide an array of arbitrary size.

FIG. 5 shows how the cell of FIG. 4 can be combined with other cells to provide an array of arbitrary size.

Returning to FIG. 1, in accordance with the invention, a direct current bias for the array 10 is applied via the output dipole antennas 30. Gate bias for each of the transistors is applied via the input dipole antennas 20. A unique gate bias voltage for each transistor in the array is provided on a row-by-row basis via a voltage divider network 140. The voltage divider network 140 includes (N-1) first resistors $R_b$ connected in series to a first source of supply potential, where N is the number of rows in the array 10. Each of the resistors is connected to provide an input voltage to one of the transistors in the array. The resistive network further includes M second resistors $R_L$ connected to a respective one of the second dipoles antennas, where M is the number of columns in the array.

Each column is DC-interconnected along the top of the array with an applied a DC voltage. The bottom of each column of the array is also DC interconnected through load resistors $R_L$ and DC-grounded. The DC voltage applied at the top of the columns is set to $NV_d+V_g$, where N is the number of rows in the array, $V_d$ is the required drain-source voltage that needs to be applied across each transistor amplifier, and $-V_g$ is the required gate-source voltage that needs to be applied to each transistor amplifier. Note that the value of the load resistor $R_L$ at the bottom of each column is selected such to provide a voltage drop of Vg across the resistor.

The gates of each transistor amplifier in the array are fed from the left side of the array as shown in FIG. 1. A voltage of $(N-1)V_g$ is applied at the top row. Each row is separated by a small value of resistance much smaller than the gate bias interconnect resistor on each unit cell. This chain of resistors functions as a voltage divider. With this topology, the gate of each transistor amplifier is fed with a voltage of Vg below its source voltage (a requirement for HEMT technology). Note that the gate voltage of (N-1)Vg can be obtained from the drain voltage supply with a simple resistive network without departing from the scope of the present teachings.

Figure 6:
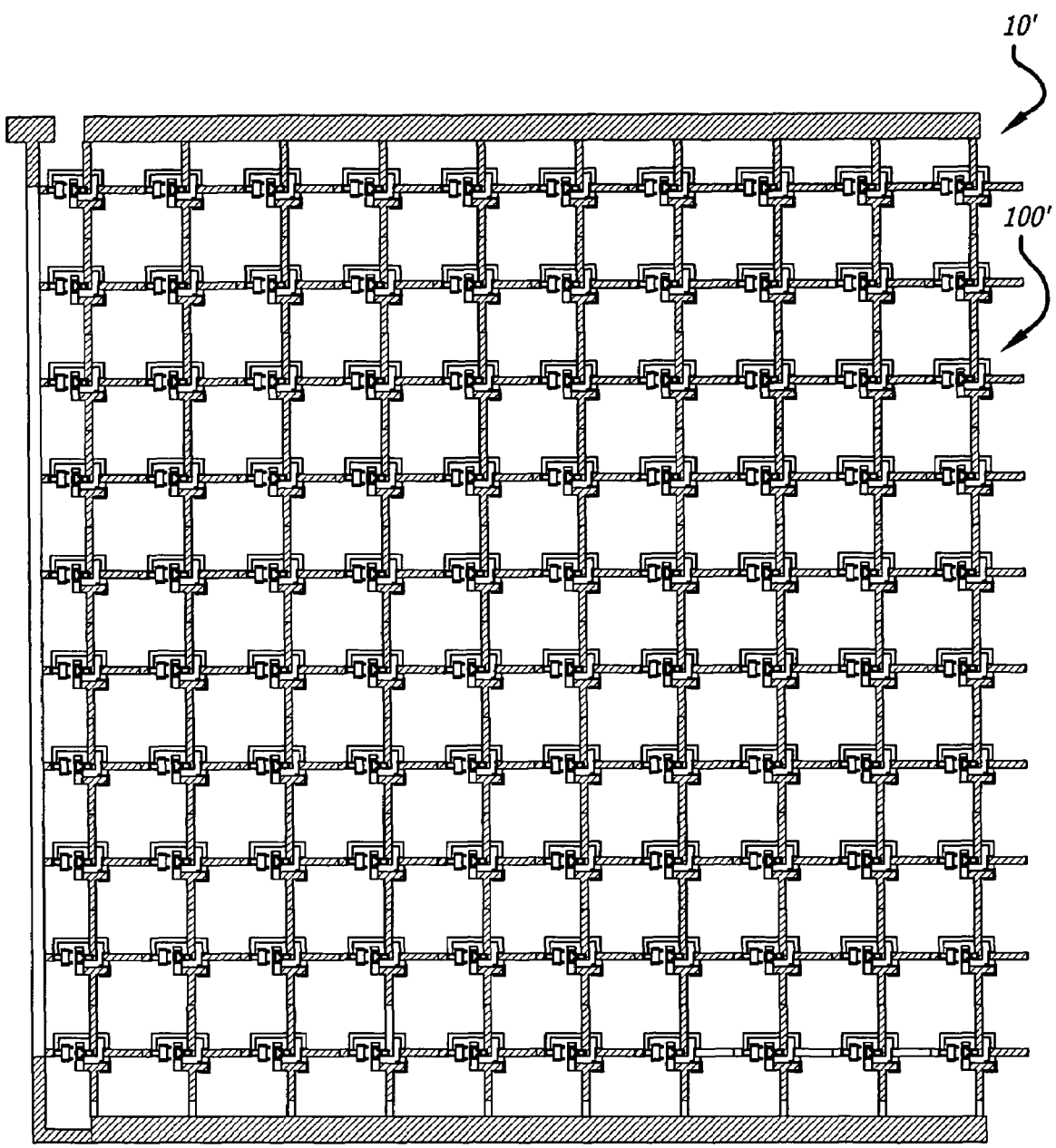
FIG. 6 shows an MHEMT implementation of an array using the cell of FIG. 4.

FIG. 6 shows an MHEMT implementation of an array using the cell of FIG. 4. Note that for this implementation, the chip should be mounted above a ground plane, separated by a substrate material.

Figure 7:
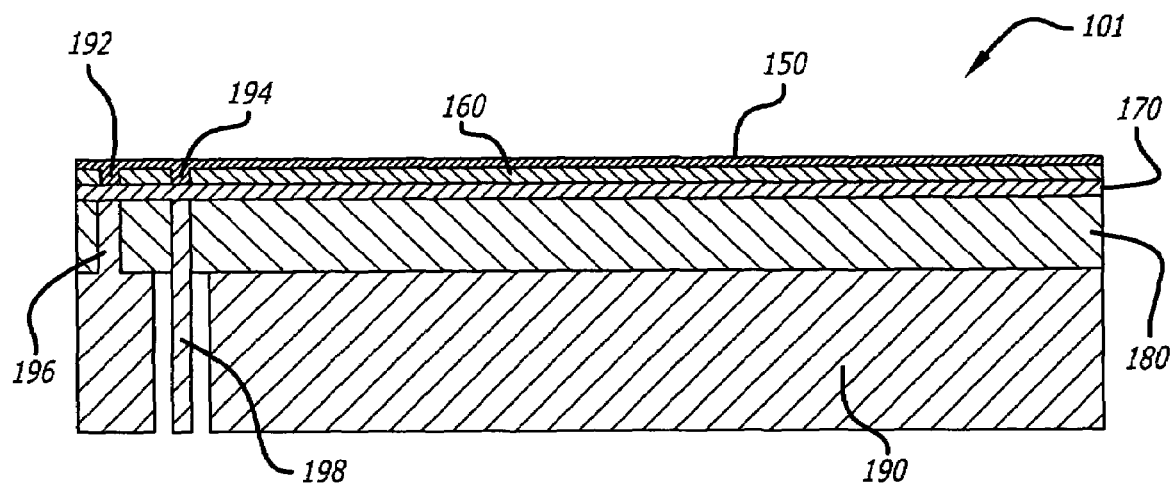
FIG. 7 is a side view of an illustrative embodiment of a chip for mounting a reflect antenna array in accordance with the present teachings.

FIG. 7 is a side view of an illustrative embodiment of a chip for mounting a reflect antenna array in accordance with the present teachings. The array 10' is fabricated by via a metallization pattern 150 which is disposed on a first substrate 160 to provide a chip construction. The chip is secured to a second substrate 180 with a bonding agent 170. The second substrate 180 has the following potentially conflicting, requirements: 1) it should conduct heat well, 2) be somewhat transparent to radio frequency (RF) energy, and 3) provide the means to provide a DC path to the chip. For the thermal requirement, the chip must be mounted very flat against the substrate.

Returning to FIG. 7, the second substrate 170 is an electrically insulative, thermally conductive dielectric substrate. The purpose of the substrate 170 is three fold. First, the substrate "stands-off" the ground plane from the dipole and allows the dipole to radiate efficiently. In fact, the dielectric constant of the substrate and its thickness can be used to "tune" the dipoles to the input and output impedance targets for the transistor amplifiers. Second, the substrate conducts heat from the transistors down to the ground plane and into a conventional heat sink 190 (e.g. made with copper or aluminum or liquid) mounted below (or as shown in FIG. 7, integral with) the ground plane. Third, the substrate provides via lines that feed the array chip with DC current. In this connection, note the chip vias 192 and 194, ground via 196 and bias via 198.

The adhesive 170 should be thermally conductive but not interfere with RF energy. The adhesive should also be electrically conductive where the DC connections are (presumably at the edge of the chip away from the dipoles). If two separate adhesives are used (one non-conductive and one conductive), then they should be matched in thickness as much as possible.

In the best mode, the bonding agent 170 is an anisotropic electrically conductive bonding film that allows current to flow along a path orthogonal to a surface of the array while blocking current flow parallel to the surface of the array.

Figure 8:
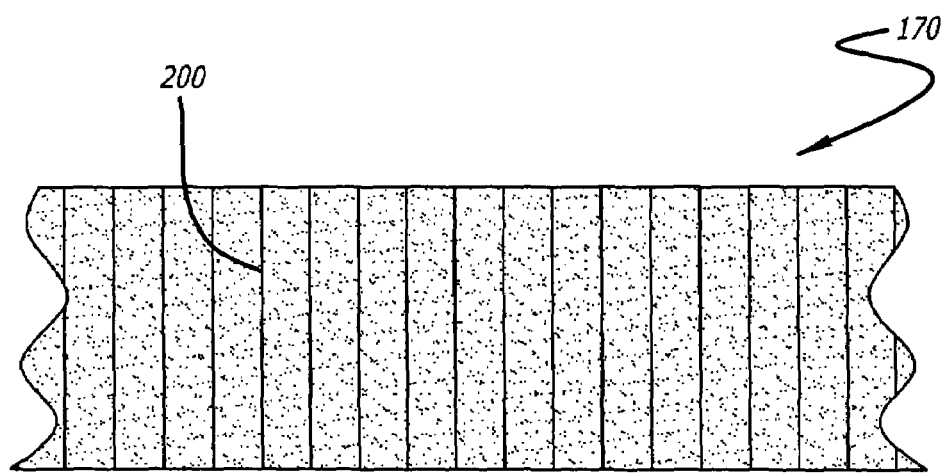
FIG. 8 is a cross-section of a bonding agent used in an illustrative embodiment of the invention.

FIG. 8 is a cross-section of a bonding agent used in an illustrative embodiment of the invention. This type of adhesive film is manufactured by several companies including B-Tech Corp. This film has vertical conductive "wires" 200 that run through the thickness of the adhesive but do not touch each other. Since there is only conductivity in one direction (through the thickness), the adhesive should have little effect on the RF patterns of the dipole antennas. Since the "wires" in the adhesive pass directly from the chip to the substrate, the thermal properties of the adhesive film should be acceptable. Finally, the "wires" will also interconnect the DC pads of the chip down to the DC pads of the substrate. Since the direct current only flows in one direction, the drain, gate and ground voltages will all be isolated one from another. Hence, a sheet of this adhesive can be utilized to attach the chip to the substrate and still allow the substrate to perform all three of its functions outlined above.

Consequently, the bonding agent should provide thermal conductivity and RF isolation. In the illustrative embodiment, the bonding agent had a thickness of 2 mils with standard thermal and electrical conductivity in the 'z' direction and standard electrical resistivity in the 'x' and 'y' directions. One of ordinary skill in the art would how to specify the coefficients of thermal expansion and contraction, and wear and age characteristics to suit a given application and intended operational environment without departure from the scope of the present teachings.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,
What is claimed is:

1. An antenna cell comprising:
   a first dipole antenna having a first orientation and a first polarization;
   a second dipole antenna having a second orientation and a second polarization; and
   an amplifier input coupled inline to said first dipole antenna and output coupled inline to said second dipole antenna.

2. The invention of claim 1 wherein said amplifier includes a transistor having an input terminal and first and second output terminals.

3. The invention of claim 2 wherein said input terminal is connected to said first dipole antenna and said output terminals are coupled to said second dipole antenna.

4. The invention of claim 2 wherein said first and second terminals are adapted to be coupled to second and first terminals respectively of a neighboring cell in an array configuration.

5. The invention of claim 2 wherein said transistor is a field-effect transistor.

6. The invention of claim 5 further including a coupling capacitor connected to one of said output terminals on a first end thereof.

7. The invention of claim 6 further including a feed forward path connected between said input terminal and a second end of said coupling capacitor.

8. The invention of claim 7 further including a resistor in said feed forward path.

9. The invention of claim 8 further including inductive means in said feed forward path.

10. The invention of claim 9 wherein said resistor and said inductor are connected in series.

11. The invention of claim 1 said second orientation and said second polarization being orthogonal to said first orientation and said first polarization.

12. The invention of claim 1 wherein said cell is implemented using an MHEMT process.

13. The invention of claim 12 wherein said MHEMT process is an InP MHEMT process.

14. An array comprising:
    N first dipole antennas having a first orientation and a first polarization;
    M second dipole antennas having a second orientation and a second polarization; and
    a plurality of unit cells, each cell including an amplifier input coupled inline to a first dipole antenna and output coupled inline to a second dipole antenna.

15. The invention of claim 14 wherein each amplifier includes a transistor having an input terminal and first and second output terminals.

16. The invention of claim 15 wherein said input terminal is connected to said first dipole antenna and said output terminals are coupled to said second dipole antenna.

17. The invention of claim 15 wherein said first and second terminals are adapted to be coupled to second and first terminals respectively of a neighboring cell in said array.

18. The invention of claim 15 wherein said transistor is a field-effect transistor.

19. The invention of claim 18 further including a coupling capacitor connected to one of said output terminals on a first end thereof.

20. The invention of claim 19 further including a feed forward path connected between said input terminal and a second end of said coupling capacitor.

21. The invention of claim 20 further including a resistor in said feed forward path.

22. The invention of claim 21 further including inductive means in said feed forward path.

23. The invention of claim 22 wherein said resistor and said inductor are connected in series.

24. The invention of claim 15 said second orientation and said second polarization being orthogonal to said first orientation and said first polarization.

25. The invention of claim 15 further including a means for providing a bias on said input terminal.

26. The invention of claim 25 wherein said means for providing a bias on said input terminal includes a resistive network.

27. The invention of claim 26 wherein said resistive network includes a voltage divider network.

28. The invention of claim 27 wherein said voltage divider network includes (N−1) first resistors $R_b$ connected in series to a first source of supply potential.

29. The invention of claim 28 wherein each of said resistors is connected to provide an input voltage to one of said transistors in said array.

30. The invention of claim 27 wherein said network includes a M second resistors $R_L$ connected to a respective one of said second dipoles antennas.

31. The invention of claim 14 wherein said array is implemented in a metallization pattern.

32. The invention of claim 31 wherein said metallization pattern is disposed on a first substrate to provide a chip.

33. The invention of claim 32 wherein said chip is secured to a second substrate with means for allowing current to flow along a path orthogonal to a surface of said array and blocking current flow parallel to said surface of said array.

34. The invention of claim 33 wherein said means for allowing current to flow is an anisotropic electrically conductive bonding film.

35. The invention of claim 14 wherein said array is implemented using an MHEMT process.

36. The invention of claim 35 wherein said MHEMT process is an InP MHEMT process.

37. A method comprising the steps of:
    providing an antenna array having:
      N first dipole antennas having a first orientation and a first polarization;
      M second dipole antennas having a second orientation and a second polarization; and
      a plurality of unit cells, each cell including an amplifier input coupled inline to a first dipole antenna and output coupled inline to a second dipole antenna
    biasing said array by applying a direct current voltage to said second dipole antenna; and illuminating said array with a low power source whereby said array receives said energy via said first dipole antenna, amplifies energy received from said source and retransmits said amplified energy via said second dipole antenna.

38. The invention of claim 37 wherein each amplifier includes a transistor having an input terminal and first and second output terminals.

39. The invention of claim 38 wherein said input terminal is connected to said first dipole antenna and said output terminals are coupled to said second dipole antenna.

40. The invention of claim 39 further including the step of applying an input bias voltage to each transistor in said array via said first dipole antenna.

41. The invention of claim 40 wherein said step of providing a bias on said input terminal includes the step of connecting a resistive network to said array.

42. The invention of claim 41 wherein said resistive network includes a voltage divider network.

43. The invention of claim 42 wherein said voltage divider network includes (N−1) first resistors $R_b$ connected in series to a first source of supply potential.

44. The invention of claim 43 wherein each of said resistors is connected to provide an input voltage to one of said transistors in said array.

45. The invention of claim 41 wherein said network includes a M second resistors $R_L$ connected to a respective one of said second dipoles antennas.

46. The invention of claim 38 wherein said first and second terminals are adapted to be coupled to second and first terminals respectively of a neighboring cell in said array.

47. The invention of claim 38 said second orientation and said second polarization being orthogonal to said first orientation and said first polarization.

48. The invention of claim 37 further including the step of implementing said array in a metallization pattern.

49. The invention of claim 48 further including the step of securing said metallization pattern to a first substrate to provide a chip.

50. The invention of claim 49 further including the step of securing said chip to a second substrate with a bonding agent adapted to allow current to flow along a path orthogonal to a surface of said array while blocking current flow parallel to said surface of said array.

51. The invention of claim 50 wherein said bonding agent for allowing current to flow is an anisotropic electrically conductive bonding film.

52. The invention of claim 37 wherein said array is implemented using an MHEMT process.

53. The invention of claim 52 wherein said MHEMT process is an InP MHEMT process.

* * * * *